(12) United States Patent
Im

(10) Patent No.: US 7,873,753 B2
(45) Date of Patent: Jan. 18, 2011

(54) MEMORY SUBSYSTEM CAPABLE OF ACCESSING A PLURALITY OF MEMORY BANK IDENTIFICATIONS AND METHOD THEREOF

(75) Inventor: Jeon Taek Im, Anseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 382 days.

(21) Appl. No.: 11/844,472

(22) Filed: Aug. 24, 2007

(65) Prior Publication Data

US 2008/0209077 A1 Aug. 28, 2008

(30) Foreign Application Priority Data

Feb. 22, 2007 (KR) ...................... 10-2007-0018084

(51) Int. Cl.
  *G06F 3/06* (2006.01)
  *G06F 13/00* (2006.01)
(52) U.S. Cl. ............................... 710/9; 10/33; 711/102; 711/103; 711/105; 711/106
(58) Field of Classification Search ............... 710/9–10, 710/33; 711/105, 156, 102, 103
See application file for complete search history.

(56) References Cited

U.S. PATENT DOCUMENTS 5,644,539 A * 7/1997 Yamagami et al. .......... 365/200
6,026,466 A * 2/2000 Su et al. ...................... 711/105
6,262,488 B1 * 7/2001 Masayuki et al. ........... 257/777
6,740,981 B2 * 5/2004 Hosomi ...................... 257/778
7,027,349 B2   4/2006 Ryan et al.
7,461,213 B2 * 12/2008 Hass et al. .................. 711/147
2004/0210729 A1 * 10/2004 Horii et al. .................. 711/156
2005/0180230 A1 * 8/2005 Fredeman et al. ........... 365/200

FOREIGN PATENT DOCUMENTS

JP    2005-258804    9/2005
KR    1020040074212 A    8/2004

OTHER PUBLICATIONS

Korean Office Action dated Apr. 29, 2008 for application KR 10-2007-0018084 of which priority is claimed in the instant application.

* cited by examiner

*Primary Examiner*—Tammara Peyton
(74) *Attorney, Agent, or Firm*—F. Chau & Associates, LLC

(57) ABSTRACT

A controller and a memory subsystem including a plurality of memory banks each having a plurality of memory devices, in which the controller includes a memory device configured to store an identification (ID) of each of the plurality of memory banks; and a control logic configured to read an ID of a memory bank to be accessed among the plurality of memory banks from the memory device, then output the ID, and then output a command. Each of the plurality of memory devices includes an input port, a register configured to store an ID of each memory device, and a determination circuit configured to receive and compare an ID input via the input port with the ID stored in the register and to generate a control signal according to a result of the comparison. The input port is enabled or disabled in response to the control signal.

14 Claims, 8 Drawing Sheets

MEMORY SUBSYSTEM CAPABLE OF ACCESSING A PLURALITY OF MEMORY BANK IDENTIFICATIONS AND METHOD THEREOF

CROSS-REFERENCE TO RELATED PATENT APPLICATION

This application claims priority under 35 U.S.C. §119 from Korean Patent Application No. 2007-0018084, filed on Feb. 22, 2007; the disclosure of which is hereby incorporated by reference in its entirety.

BACKGROUND OF THE INVENTION

1. Technical Field

The present disclosure relates to a semiconductor circuit and, more particularly, to a memory subsystem capable of using bank identification (ID), a controller and a memory device included in the memory subsystem, and a method of operating the memory subsystem.

2. Discussion of Related Art

FIG. 1 is a block diagram of a conventional memory subsystem 10. The memory subsystem 10 includes a controller 20 and a plurality of memory banks 30-1 through 30-n, where "n" is a natural number. The first memory bank 30-1 includes a plurality of memory devices 31-1 and 32-1 and the n-th memory bank 30-n includes a plurality of memory devices 31-n and 32-n.

The controller 20 and the memory banks 30-1 through 30-n share a 16-bit data bus 21 including a pair of 8-bit data buses. The controller 20 provides a clock signal CLK, an address signal ADD, bank select signals BS#0 to BS#n, and at least one control signal CTRL for controlling each of the memory devices 31-1, 32-1, 31-n, and 32-n.

In the conventional memory subsystem 10, when the number of memory banks 30-1 through 30-n increases, the number of bank selection signals BS#0 through BS#n that must be generated by the controller 20 to select the banks 30-1 through 30-n is increased by an increment of the number of the banks 30-1 through 30-n. Accordingly, the number of pins of the controller 20 for outputting the bank selection signals BS#0 through BS#n is also increased and, therefore, the design of the controller 20 becomes complicated. As a result, the design of the memory subsystem 10 including the controller 20 is also complicated. Moreover, when the memory devices 31-1, 32-1, 31-n, and 32-n are implemented by flash memory, for example, flash electrically erasable programmable read-only memory (EEPROM), the internal delay time of the flash EEPROM becomes relatively longer.

Furthermore, each of the memory devices 31-1, 32-1, 31-n, and 32-n does not include a port or a pin for outputting a signal concerning its own operating status, for example, a write status, a read status, an erase status, or a program status. Accordingly, the controller 20 detects the operating status of each of the memory devices 31-1, 32-1, 31-n, and 32-n by receiving operating status signals from the memory devices 31-1, 32-1, 31-n, and 32-n via the data bus 21 and, therefore, the controller 20 cannot accurately check the operating statuses of the memory devices 31-1, 32-1, 31-n, and 32-n at a desired time. In other words, while the controller 20 is transmitting and receiving data to and from one of the memory banks 30-1 through 30-n via the data bus 21 the data exists on the data bus 21 and, therefore, the controller 20 cannot check the operating status of a desired one of the memory banks 30-1 through 30-n.

SUMMARY OF THE INVENTION

Exemplary embodiments of the present invention provide a controller for reducing the number of pins for outputting bank selection signals and facilitating its design by not using bank selection signals, and a memory subsystem including the controller.

Exemplary embodiments of the present invention also provide a controller capable of checking the state of a memory device at a desired time during an access operation, and a memory subsystem including the controller.

Exemplary embodiments of the present invention also provide a method of operating the memory subsystem.

According to exemplary embodiments of the present invention, there is provided a controller including a memory device configured to store an identification (ID) of each of a plurality of memory banks, and a control logic configured to read an ID of a memory bank to be accessed among the plurality of memory banks from the memory device, then output the ID, and then output a command. The command may be a read command, a write command, an erase command, a program command, or a status check command.

According to exemplary embodiments of the present invention, there is provided a non-volatile memory device including an input port; a register configured to store an ID of the non-volatile memory device, and a determination circuit configured to receive and compare an ID input via the input port with the ID stored in the register and to generate a first control signal according to a result of the comparison. The input port may be enabled or disabled in response to the first control signal.

The non-volatile memory device may further include a plurality of pins for programming the ID to the register. At this time, an input port that is disabled in response to the first control signal may transmit another ID input following the input ID to the determination circuit.

The non-volatile memory device may further include an address decoder connected with the input port. At this time, the input port that is enabled in response to the first control signal may transmit an input address to the address decoder. The address decoder may determine whether the address is completely input to the address decoder based on a clock signal and, when the address is completely input, may output to the input port a second control signal for disabling the input port.

The non-volatile memory device may further include a status check register configured to store a status check signal indicating an operating status of the non-volatile memory device. The status check register may output the status check signal in response to a status check command input via the input port.

The nonvolatile memory device may further include a memory array including a plurality of memory cells, an address decoder configured to decode an address input via the input port, and an input/output buffer configured to buffer data to be written to a memory cell selected by the address decoder from among the plurality of memory cells or data to be output from the selected memory cell. In an exemplary embodiment, the status check register may receive the status check signal generated based on data that is buffered by the input/output buffer. Each of the memory cells may be a flash memory cell.

According to exemplary embodiments of the present invention, a non-volatile memory device includes a buffer comprising an input terminal, a first output terminal, and a second output terminal; an address decoder connected with the second output terminal of the buffer; a register configured to store an ID of the non-volatile memory device; and a determination circuit connected between the first output terminal of the buffer and the register and configured to receive and compare an ID input via the first output terminal of the buffer with the ID stored in the register and to generate a first control signal according to a result of the comparison. The buffer may switch the input terminal and the second output terminal in response to the first control signal.

In exemplary embodiments, a memory subsystem includes a plurality of memory banks, a controller configured to control operation of each of the memory banks, and a first bus connected between each of the memory banks and the controller. The controller may output an ID of a memory bank to be accessed among the plurality of memory banks via the first bus before outputting a command to the memory bank to be accessed. The command may be a read command, a write command, an erase command, a program command, or a status check command.

The memory subsystem may further include a second bus connected between each of the memory banks and the controller. The controller may output a status check command to the memory bank to be accessed via the first bus and then receive a status check signal output from the memory bank to be accessed via the second bus so as to check a status of the memory bank to be accessed. The memory subsystem may be a memory module.

In exemplary embodiments, a method of operating a memory subsystem including a plurality of memory banks and a controller controlling an operation of each of the memory banks includes outputting an ID of a first memory bank among the plurality of memory banks to the plurality of memory banks, using the controller; and outputting a command to the plurality of memory banks after outputting the ID, using the controller.

When the command is a read command, the method may further include outputting an address, the ID of the first memory bank, and a status check command to the plurality of memory banks, using the controller; outputting a read enable command to the first memory bank in response to a status check signal output from the first memory bank, using the controller; and receiving data which is output from the first memory bank and corresponds to the address.

When the command is a write command, the method may further include outputting an address, a write enable command, data to be written, the ID of the first memory bank, and a status check command to the plurality of memory banks, using the controller.

When the command is an erase command, the method may further include outputting an address, an erase enable command, the ID of the first memory bank, and a status check command to the plurality of memory banks, using the controller.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Figure 1:
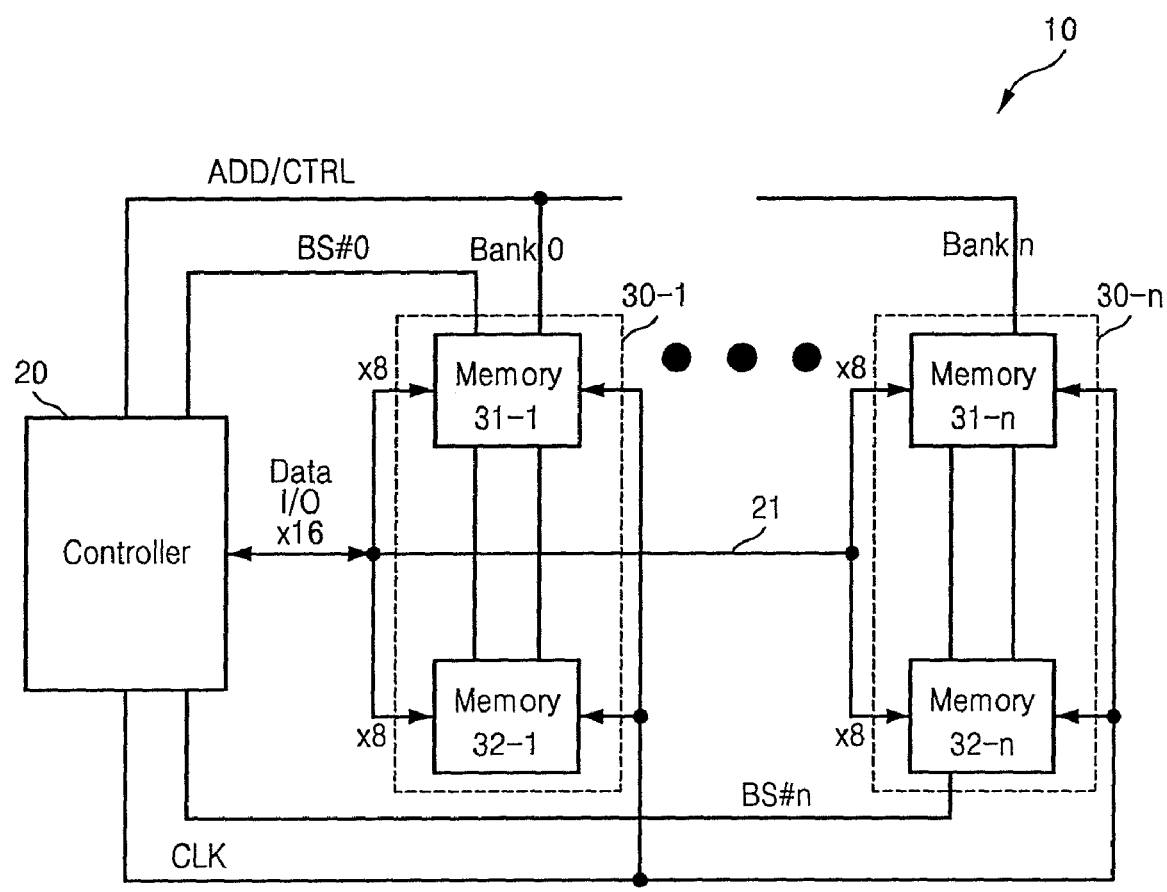
FIG. 1 is a block diagram of a conventional memory subsystem including a controller and a plurality of banks.

Exemplary embodiments of the present invention now will be described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art. In the drawings, like numbers refer to like elements throughout.

Figure 2:
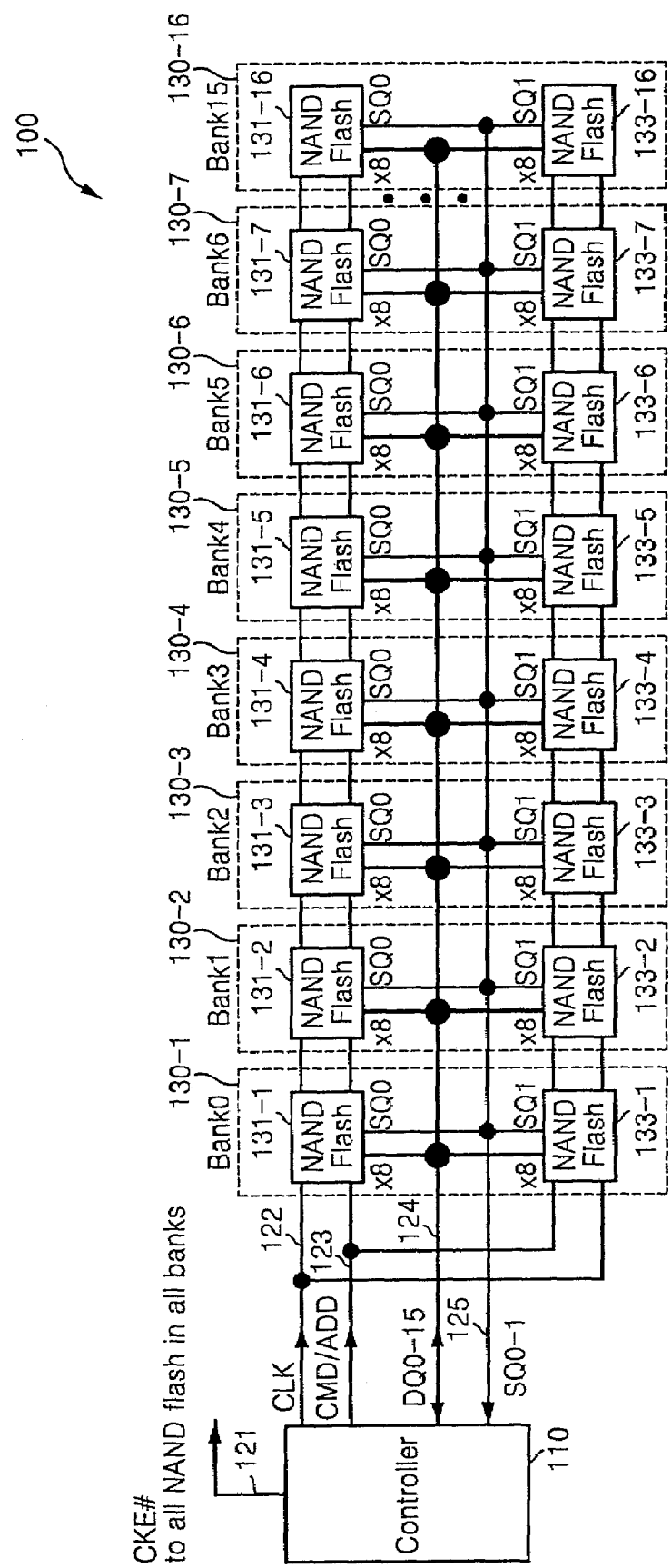
FIG. 2 is a block diagram of a memory subsystem including a controller and a plurality of memory banks, according to an exemplary embodiment of the present invention.

FIG. 2 is a block diagram of a memory subsystem 100 according to an exemplary embodiment of the present invention. The memory subsystem 100 includes a controller 110 and a plurality of memory banks 130-1 through 130-n, where "n" is a natural numbers for example, 16. Each of the memory banks 130-1 through 130-16, which may be referred to as multi-banks, includes a plurality of memory devices 131-n and 133-n, where "n" is 1 through 16. For instance, the first memory bank 130-1 includes a plurality of memory devices 131-1 and 133-1 and the sixteenth memory bank 130-16 includes a plurality of memory devices 131-16 and 133-16. The memory subsystem 100 may be a memory module, which may be installed on a main board of a computer, for example.

The memory devices 131-1 through 131-16 and 133-1 through 133-16 have the same structures. Each of the memory devices 131-1 through 131-16 and 133-1 through 133-16 may be implemented by a non-volatile memory device, such as an electrically erasable programmable read-only memory (EEPROM) device or a NAND flash memory as shown.

The controller 110 provides a clock enable signal CKE# and a clock signal CLK via buses 121 and 122, respectively, to the memory devices 131-1 through 131-16 and 133-1 through 133-16. In addition, the controller 110 outputs a command CMD and/or an address ADD to the memory devices 131-1 through 131-16 and 133-1 through 133-16 via an a-bit bus 123, where "a" is a natural number, for example, a=4. The command CMD may be a read command, a write command, an erase command, a program command, or a status check command.

The controller 110 may also transmit and receive data to and from the memory devices 131-1 through 131-16 and 133-1 through 133-16 via a data bus 124 including a pair of b-bit buses, where "b" is a natural number: for example: b=8. The controller 11Q may receive a status check signal SQ0 or SQ1 output from each of the memory devices 131-1 through 131-16 and 133-1 through 133-16 via a bus 125 and may determine or check an operating status of each of the memory devices 131-1 through 131-16 and 133-1 through 133-16 based on the received status check signal SQ0 or SQ1. Accordingly, the controller 110 can check the operating status of each of the memory devices 131-1 through 131-16 and 133-1 through 133-16 at a desired time.

Figure 3:
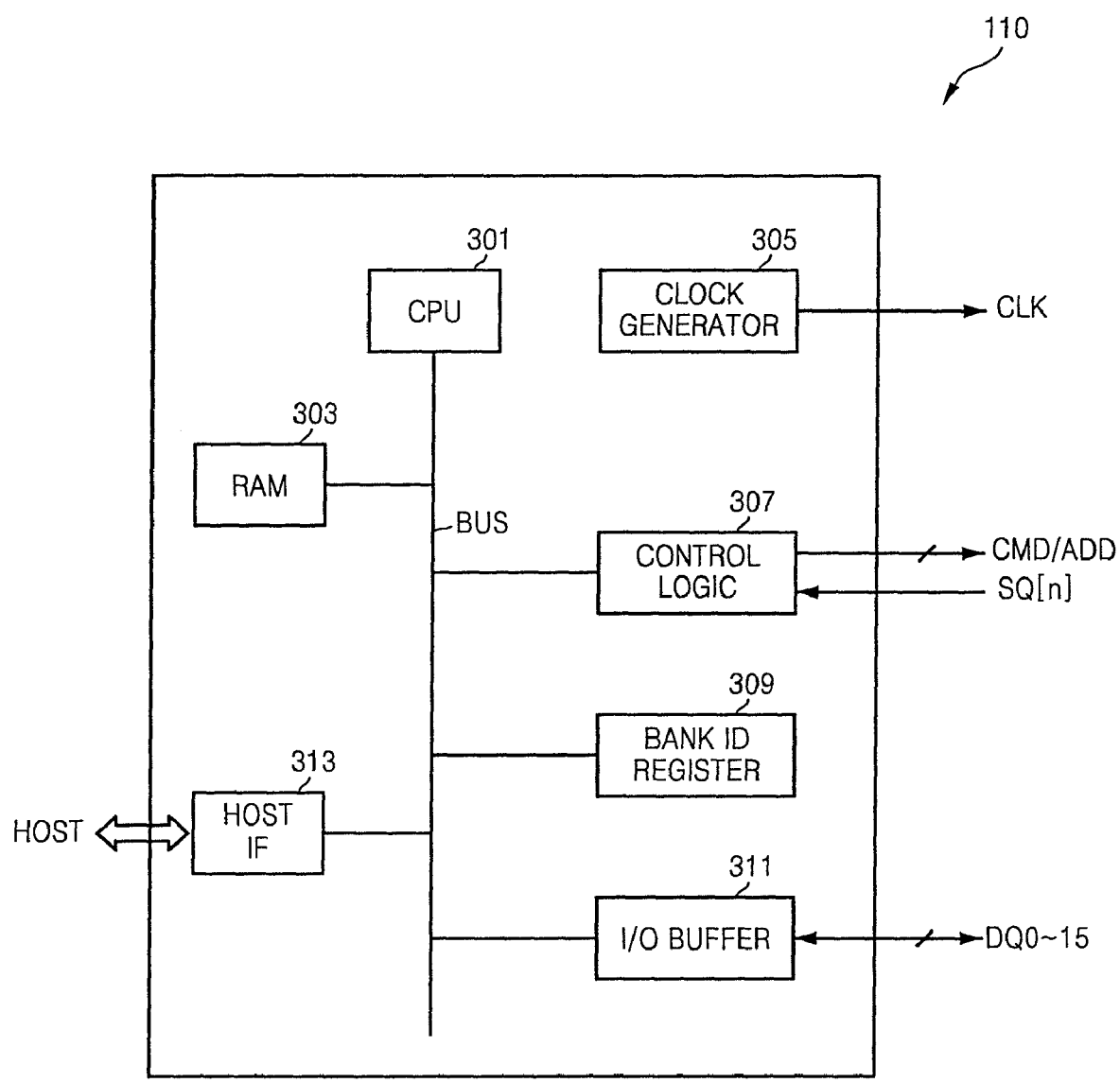
FIG. 3 is a block diagram of the controller illustrated in FIG. 2, according to an exemplary embodiment of the present invention.

FIG. 3 is a block diagram of the controller 110 illustrated in FIG. 2, according to an exemplary embodiment of the present invention. Referring to FIGS. 2 and 3, the controller 110 includes a central processing unit (CPU) or processor 301 generating the command CMD and/or the address ADD, a volatile memory device 303 temporarily storing data DQ0 through DQ15 input/output via an input/output (I/O) buffer 311, a clock generator 305 generating the clock signal CLK, a control logic 307, and a memory bank identification (ID) register 309, all of which are interconnected by a bus BUS. The controller 110 may further include a circuit (not shown) for outputting the clock enable signal CKE# shown in FIG. 2. The volatile memory device 303 may be implemented by a RAM device.

The memory bank ID register 309 performs a memory function for storing an ID of each of the memory banks 130-1 through 130-16. Each ID may be composed of "c" bits, where "c" is a natural number, for example, c=4. The control logic 307 reads the ID of a memory bank to be accessed among the memory banks 130-1 through 130-16 from the memory bank ID register 309 and outputs the ID via the a-bit bus 123. Right after that, the control logic 307 outputs the command CMD via the a-bit bus 123.

During initialization after power-on, the CPU 301 or the control logic 307 may read an ID stored in a register, shown at 401 in FIG. 44 which is included in each of the memory devices 131-1 through 131-16 and 133-1 through 133-16 forming the memory banks 130-1 through 130-16, via the ID buffer 311 connected with the data bus 124 and may store the ID in the bank ID register 309. During an actual access, for example, a write operation, a read operation an erase operation, a program operation, or a status check operation, the control logic 307 reads the ID of a memory bank to be accessed among the IDs stored in the bank ID register 309 and outputs the ID to the a-bit bus 123.

The controller 110 may further include a host interface (IF) 313. A host may transmit and receive data to and from the volatile memory device 303 via the host IF 313.

Figure 4:
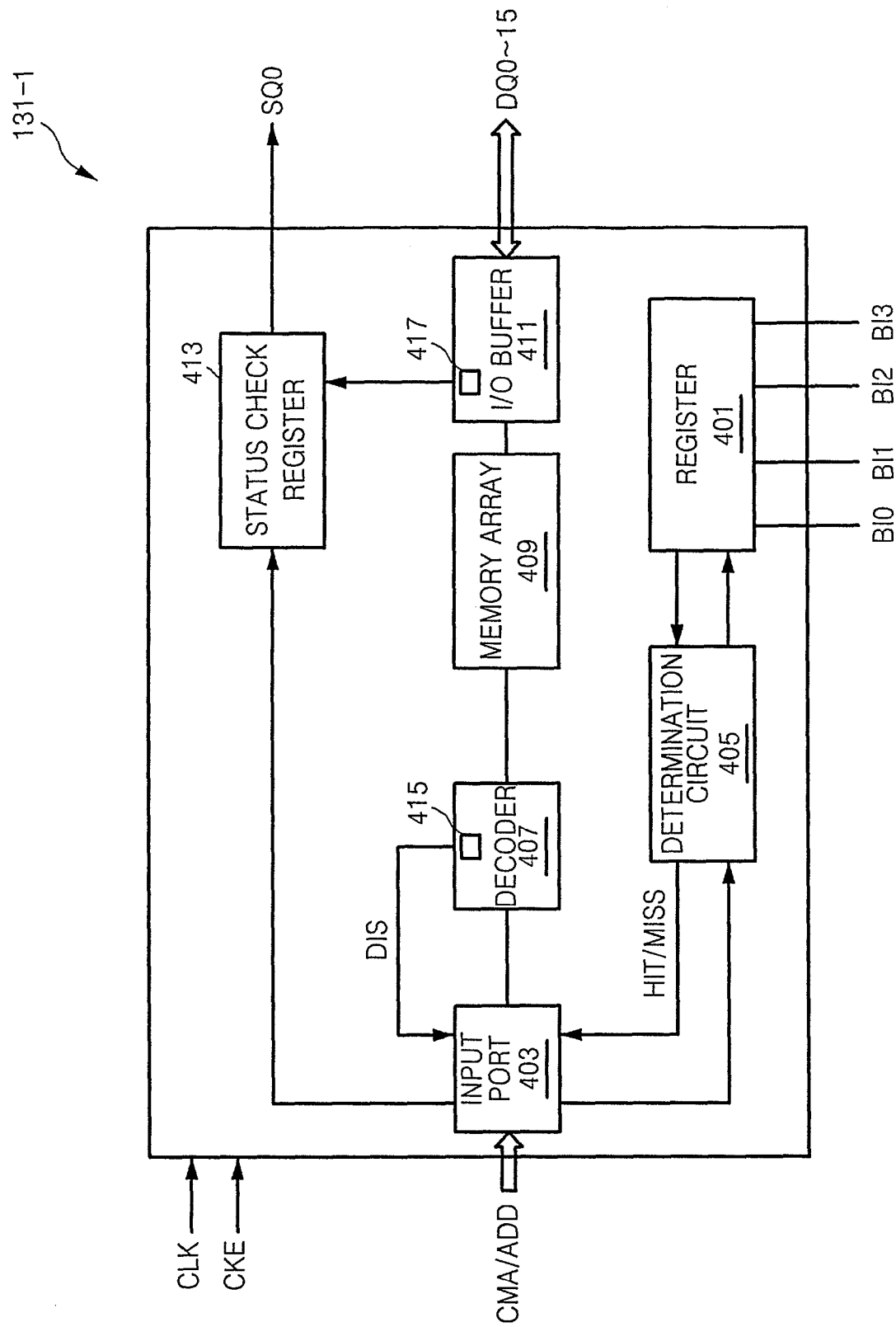
FIG. 4 is a block diagram of a memory device, according to an exemplary embodiment of the present invention.

FIG. 4 is a block diagram of the memory device 131-1, according to an exemplary embodiment of the present invention. Referring to FIG. 4, the memory device 131-1 may be implemented by a flash memory device, for example, a NAND flash memory device, and includes a register 401 storing the ID of the memory device 131-1, an input port 4034 and a determination circuit 405. It will be satisfactory if the ID is information for distinguishing the memory device 131-1 from other memory devices.

The memory device 131-1 further includes a plurality of pins BI0 through BI3 for programming or setting the ID in the register 401. For instance, each of the pins BI0 through BI3 may be implemented by a wire. Although the four pins BI0 through BI3 are illustrated in FIG. 4, the number of pins may be greater or less than four according to the number of memory banks included in the memory subsystem 100.

The determination circuit 405 receives and compares an ID of a memory bank, which is input via the input port 403, for example, an ID output from the controller 110, with the ID stored in the register 401 and generates a first control signal HIT/MISS according to a result of the comparison. The determination circuit 405 may be implemented by a decoder including a register (not shown) for temporarily storing the ID of the memory bank that is input. The input port 403 is enabled or disabled in response to the first control signal HIT/MISS.

When the ID of the input memory bank is the same as the ID stored in the register 401, the determination circuit 405 outputs the first control signal HIT at a first level, for example, a high level. Accordingly, the input port 403 is enabled in response to the first control signal HIT at the first level. When the ID of the input memory bank is different from the ID stored in the register 401, however, the determination circuit 405 outputs the first control signal MISS at a second level, for example, a low level. Accordingly, the input port 403 is disabled in response to the first control signal MISS at the second level.

When the input port 403 is enabled, the input port 403 can transmit the command CMD and/or the address ADD to an internal circuit, for example, an address decoder 407 or a status check register 413. When the input port 403 is disabled, the input port 403 cannot transmit the command CMD and/or the address ADD to the internal circuit, for example, the address decoder 407 or the status check register 413.

As shown in FIG. 4, the memory device 131-1 may further include the address decoder 407, a memory array 409, an I/O buffer 411, and the status check register 413. The memory array 409 includes a plurality of memory cells, for example, flash memory cells. The address decoder 407 decodes the address ADD, which is input via the input port 403, in order to select one memory cell from among the plurality of memory cells.

An auto-lock determination circuit 415 included in the address decoder 407 determines whether the address ADD output from the input port 403 is completely input to the address decoder 407 based on the cycle of the clock signal CLK. When the address ADD is completely input, the address decoder 407 may output a second control signal DIS to the input port 403 in order to disable the input port 403. According to an exemplary embodiment of the present invention, the auto-lock determination circuit 415 may also be implemented outside the address decoder 407.

The I/O buffer 411 buffers data to be written to at least one memory cell selected by the address decoder 407 from among the plurality of memory cells or data output from the at least one selected memory cell.

The status check register 413 stores a status check signal SQ0, status check information, indicating the operating status of the memory device 131-1. The status check register 413 outputs the stored status check signal SQ0 to the controller 110 via the bus 125 in response to a status check command ST shown in FIGS. 5 through 7 that is input via the input port 403.

The I/O buffer 411 may include a check signal generation circuit 417 that generates the status check signal based on the buffered data. According to an exemplary embodiment of the present invention, the check signal generation circuit 417 may also be implemented outside the I/O buffer 411. The check signal generation circuit 417 may be implemented by a multiplexer that receives buffered parallel data.

According to an exemplary embodiment of the present invention, the input port 403 included in the memory device 131-1 may be implemented by a buffer that includes an input terminal for receiving the command CMD and/or the address ADD, a first output terminal, and a second output terminal. In this exemplary embodiment, the address decoder 407 is connected with the second output terminal of the input port 403. The determination circuit 405 is connected between the first output terminal of the input port 403 and the register 401, compares an ID input via the first output terminal with the ID stored in the register 401, and outputs the first control signal HIT/MISS generated according to the comparison result to the input port 403. The input port 403 connects the input terminal and the second output terminal in response to the first control signal HIT at a first level and disconnects them in response to the first control signal MISS at a second level.

Figure 5:
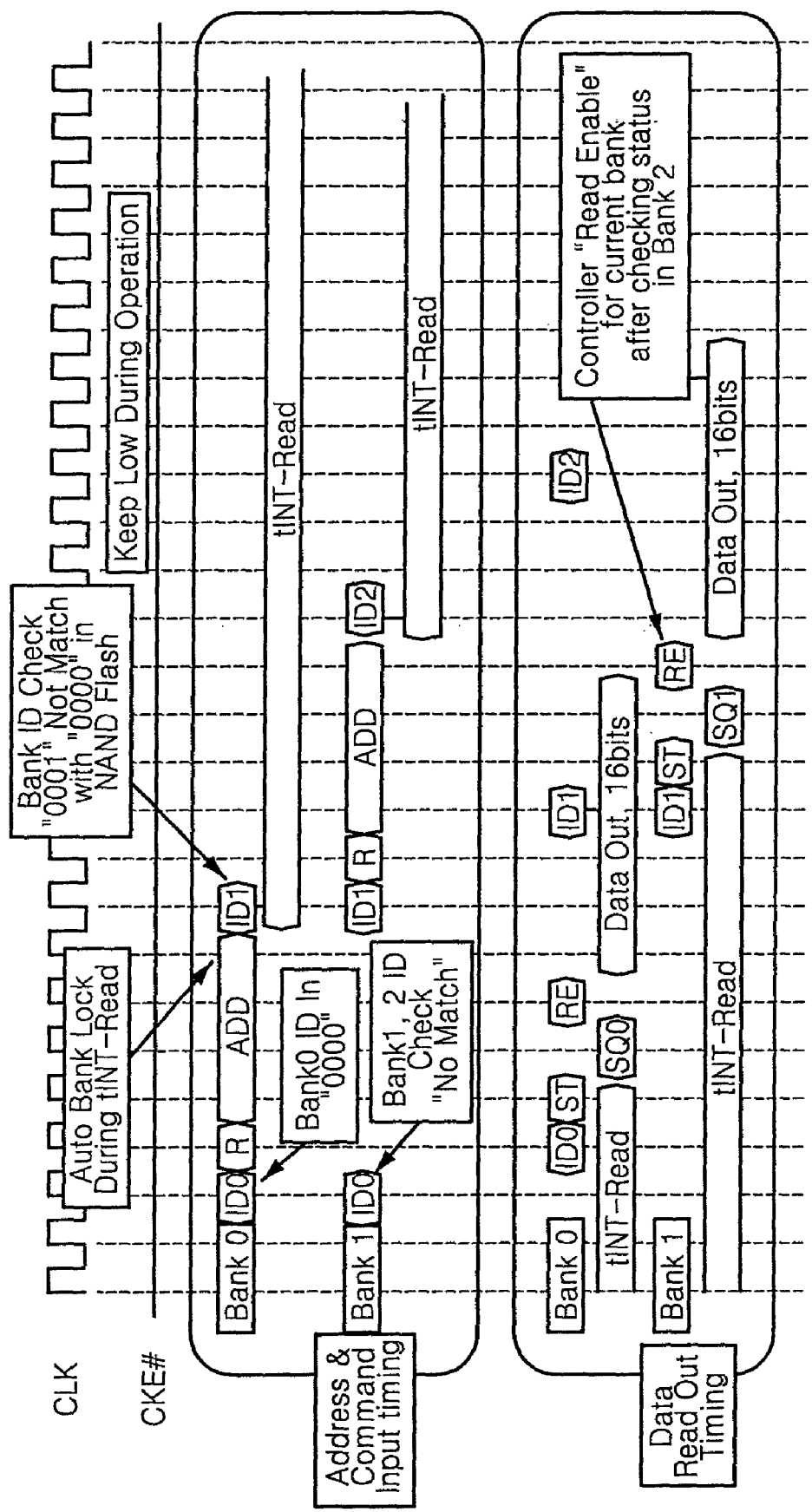
FIG. 5 is a timing chart illustrating a read operation of the memory subsystem illustrated in FIG. 2, according to an exemplary embodiment of the present invention.

FIG. 5 is a timing chart illustrating a read operation of the memory subsystem 100 illustrated in FIG. 2, according to an exemplary embodiment of the present invention. In FIG. 5, it is assumed that a 4-bit ID is stored in the register 401 that is included in each of the memory devices 131-1 through 131-16 and 133-1 through 133-16 forming the memory banks 130-1 through 130-16, as illustrated in Table 1 hereinbelow. In addition, it is assumed that registers 401 respectively implemented in a plurality of memory devices forming one memory bank store the same 4-bit ID. For instance, an ID of "0000" may be stored in the register 401 implemented in each of the memory devices 131-1 and 133-1 included in the first bank 130-1; an ID of "0001" may be stored in the register 401 implemented in each of the memory devices 131-2 and 133-2 included in the second bank 130-2; and an ID of "1111." may be stored in the register 401 implemented in each of the memory devices 131-16 and 133-16 included in the sixteenth bank 130-16. In this exemplary embodiment, data "0" indicates that each of the pins BI0 through BI3 is connected with a ground potential, and data "1" indicates that each of the pins BI0 through B13 is connected with a power supply voltage, or vice versa.

signal CLK. When the address ADD is completely input, the address decoder 407 outputs the second control signal DIS to the input port 403 for disabling the input port 403.

Accordingly, the input port 403 does not transfer an additional command or address to the address decoder 407, which is referred to as an auto bank lock. At this time, a signal path between the input port 403 and the address decoder 407 is interrupted, but a signal path between the input port 403 and the determination circuit 405 is not interrupted. As a result, the ID output from the controller 110 can be input to the determination circuit 405 at any time. The auto bank lock is maintained until data output from the memory array 409 to the I/O buffer 411 is completely output (tINT-Read).

In order to determine whether each of the memory devices 131-1 and 133-1 included in the first memory bank 130-1 is ready to output data, the controller 110 outputs the ID; that is ID0="0000", of the first memory bank 130-1 to the a-bit bus 123 before outputting a status check command ST. At this time, the determination circuit 405 included in each of the memory devices 131-1 through 131-16 and 133-1 through 133-16 compares the ID, that is, ID0="0000" of the first memory bank 130-1, which is input via the input port 403, with the ID stored in the register 401 bit by bit. Because only the input port 403 included in each of the memory devices 131-1 and 133-1 included in the first memory bank 130-1 is

TABLE 1

|     | Bank 0 | Bank 1 | Bank 2 | Bank 3 | Bank 4 | Bank 5 | Bank 6 | Bank 7 | Bank 8 | Bank 9 | Bank 10 | Bank 11 | Bank 12 | Bank 13 | Bank 14 | Bank 15 |
|-----|--------|--------|--------|--------|--------|--------|--------|--------|--------|--------|---------|---------|---------|---------|---------|---------|
| B10 | 0      | 0      | 0      | 0      | 0      | 0      | 0      | 0      | 1      | 1      | 1       | 1       | 1       | 1       | 1       | 1       |
| B11 | 0      | 0      | 0      | 0      | 1      | 1      | 1      | 1      | 0      | 0      | 0       | 0       | 1       | 1       | 1       | 1       |
| B12 | 0      | 0      | 1      | 1      | 0      | 0      | 1      | 1      | 0      | 0      | 1       | 1       | 0       | 0       | 1       | 1       |
| B13 | 0      | 1      | 0      | 1      | 0      | 1      | 0      | 1      | 0      | 1      | 0       | 1       | 0       | 1       | 0       | 1       |

The read operation performed by the memory subsystem 100 according to an exemplary embodiment of the present invention will be described with reference to FIGS. 2 through 5 below.

After a single cycle after the controller 110 outputs the clock enable signal CKE# at a low level to the bus 121, the input port 403 of each of the memory devices 131-1 through 131-16 and 133-1 through 133-16 in the memory banks 130-1 through 130-16 is enabled. The controller 110 reads the ID, that is, ID0="0000", of the first memory bank 130-1 from the memory bank ID register 309 and outputs the ID to the a-bit bus 123. Then, the determination circuit 405 in each of the memory devices 131-1 through 131-16 and 133-1 through 133-16 compares the ID of the first memory bank 130-1, which is input via the input port 403, with the ID stored in the register 401. As a result of the comparison, the input port 403 of only the memory devices 131-1 and 133-1 included in the first memory bank 130-1 is enabled in response to the first control signal HIT at the first level.

The controller 110 sequentially outputs a read command R and the address ADD to the a-bit bus 123. The input port 403 of each of the memory devices 131-1 and 133-1 included in the first memory bank 130-1 outputs the read command R to an internal circuit (not shown) and outputs the address ADD to the address decoder 407.

The auto-lock determination circuit 415 included in the address decoder 407 determines whether the address ADD is completely input based on the number of cycles of the clock enabled, the input port 403 in each of the memory devices 131-1 and 133-1 can output the status check command ST to the status check register 413.

Accordingly, when each of the memory devices 131-1 and 133-1 included in the first memory bank 130-1 is ready to output data, the status check registers 413 included in the respective memory devices 131-1 and 133-1 can respectively output the status check signals SQ0 and SQ1 to the controller 110 via the bus 125. Each of the status check signals SQ0 and SQ1 may be data "1" or data "0". When the data is completely output, each of the status check signals SQ0 and SQ1 may be data "1". Otherwise, each of the status check signals SQ0 and SQ1 may be data "0".

According to an exemplary embodiment of the present invention, the status check signals SQ0 and SQ1 may be transmitted to the controller 110 via the bus 125 with a predetermined time difference. The controller 110 outputs a read enable command RE to the a-bit bus 123 in response to the status check signal SQ0 or SQ1. Accordingly, each of the memory devices 131-1 and 133-1 included in the first memory bank 130-1 outputs data stored in the I/O buffer 411 to the controller 110 via the data bus 124 in response to the read enable command RE. The data may be stored in the volatile memory device 303 and then output to the host via the host IF 313.

After the auto bank lock of the first memory bank 130-1 is completed, the controller 110 may output an ID of one memory bank among the remaining memory banks 130-2 through 130-16 to the a-bit bus 123, so that an access to a memory bank can be performed. In other words, the memory subsystem 100 according to an exemplary embodiment of the present invention may perform a memory bank interleaving read operation, as illustrated in FIG. 5.

Figure 6:
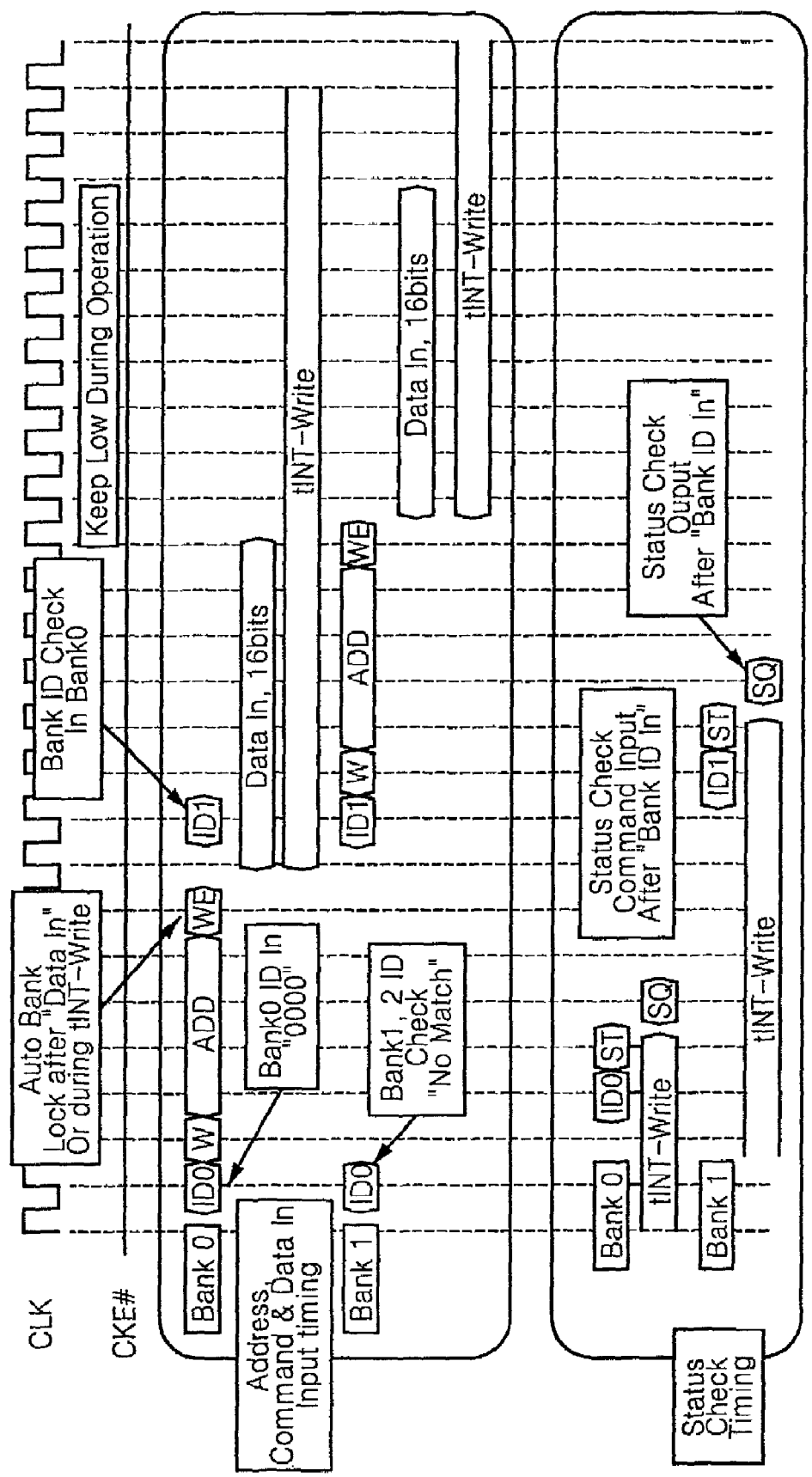
FIG. 6 is a timing chart illustrating a write operation of the memory subsystem illustrated in FIG. 2, according to an exemplary embodiment of the present invention.

FIG. 6 is a timing chart illustrating a write operation of the memory subsystem 100 illustrated in FIG. 2, according to an exemplary embodiment of the present invention. The write operation performed by the memory subsystem 100 will be described below with reference to FIGS. 2 through 4 and FIG. 6.

After a single cycle following when the controller 110 outputs the clock enable signal CKE# at a low level to the bus 121, the input port 403 of each of the memory devices 131-1 through 131-16 and 133-1 through 133-16 is enabled. The controller 110 reads the ID, that is, ID0="0000" of the first memory bank 130-1 from the memory bank ID register 309 and outputs the ID to the a-bit bus 123. Then, the determination circuit 405 in each of the memory devices 131-1 through 131-16 and 133-1 through 133-16 compares the ID of the first memory bank 130-1, which is input via the input port 403, with the ID stored in the register 401. As a result of the comparison, only the input port 403 of each of the memory devices 131-1 and 133-1 is enabled in response to the first control signal HIT at the first level.

The controller 110 sequentially outputs a write command W and the address ADD to the a-bit bus 123. The input port 403 of each of the memory devices 131-1 and 133-1 included in the first memory bank 130-1 outputs the write command W to an internal circuit (not shown) and outputs the address ADD to the address decoder 407. The auto-lock determination circuit 415 included in the address decoder 407 determines whether the address ADD is completely input based on the number of cycles of the clock signal CLK. When the address ADD is completely input, the address decoder 407 outputs the second control signal DIS for disabling the input port 403 to the input port 403.

During an auto bank lock, a signal path between the input port 403 and the address decoder 407 is interrupted, but a signal path between the input port 403 and the determination circuit 405 is not interrupted. The controller 110 outputs a write enable command WE to the a-bit bus 123 and data to be written to the data bus 124. When the data to be written is completely input to the I/O buffer 411 in each of the memory devices 131-1 and 133-1 included in the first memory bank 130-1, the I/O buffer 411 may be disabled.

The auto bank lock is maintained until the data to be written is completely input to the I/O buffer 411 or is completely stored in the memory cell array 409 (iINT-Write). In order to determine whether the data to be written is completely written to the I/O buffer 411 or the memory cell array 409, the controller 110 outputs the ID of the first memory bank 130-1 to the a-bit bus 123 before outputting a status check command ST to the a-bit bus 123.

Because only the input port 403 included in each of the memory devices 131-1 and 133-1 included in the first memory bank 130-1 is enabled, the input port 403 in each of the memory devices 131-1 and 133-1 can output the status check command ST output from the controller 110 to the status check register 413.

Accordingly, when the data to be written is completely written to the I/O buffer 411 or the memory cell array 409, the status check registers 413 included in the respective memory devices 131-1 and 133-1 of the first memory bank 130-1 can respectively output the status check signals SQ0 and SQ1 to the controller 110 via the bus 125. Accordingly, the controller 110 can determine whether the data to be written is completely written based on the status check signals SQ0 and SQ1.

After the data to be written is completely written to the first bank 130-1, the controller 110 may read an ID of one memory bank from among the remaining memory banks 130-2 through 130-16 and output the ID to the a-bit bus 123, so that access to a memory bank can be performed. In other words, the memory subsystem 100 according to an exemplary embodiment of the present invention may perform a memory bank interleaving write operation as illustrated. In FIG. 6.

Figure 7:
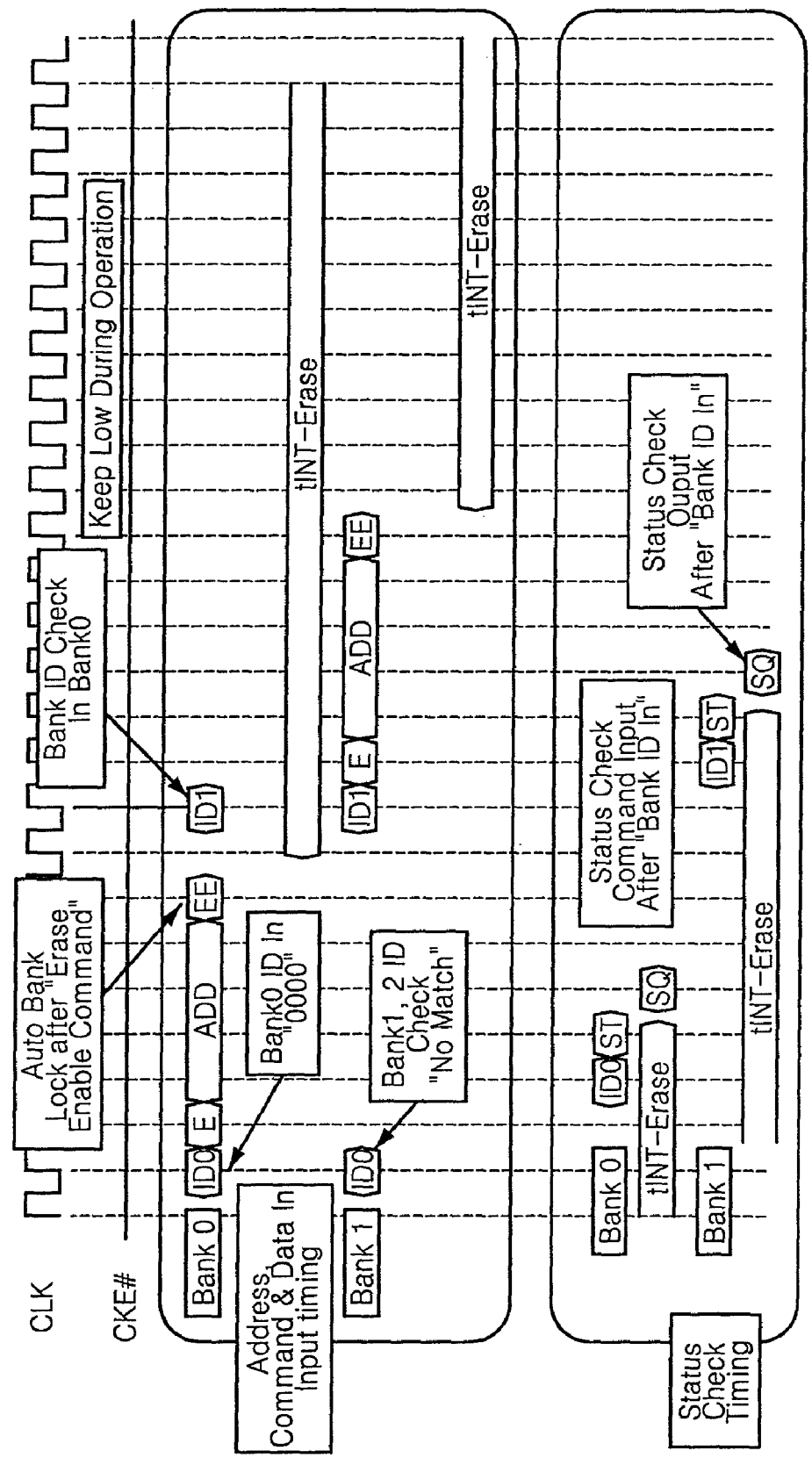
FIG. 7 is a timing chart illustrating an erase operation of the memory subsystem illustrated in FIG. 2, according to an exemplary embodiment of the present invention.

FIG. 7 is a timing chart illustrating an erase operation of the memory subsystem 100 illustrated in FIG. 2, according to an exemplary embodiment of the present invention. The erase operation performed by the memory subsystem 100 will be described below with reference to FIGS. 2 through 4 and FIG. 7.

The controller 110 reads the ID, that is, ID0="0000", of the first memory bank 130-1 from the bank ID register 309 and outputs the ID to the a-bit bus 123. Then, the determination circuit 405 in each of the memory devices 131-1 through 131-16 and 133-1 through 133-16 compares the ID of the first memory bank 130-1, which is input via the input port 403, with the ID stored in the register 401. As a result of the comparison, only the input port 403 of each of the memory devices 131-1 and 133-1 is enabled in response to the first control signal HIT at the first level.

The controller 110 sequentially outputs an erase command E and the address ADD to the a-bit bus 123. The input port 403 of each of the memory devices 131-1 and 133-1 outputs the erase command E to an internal circuit (not shown) and outputs the address ADD to the address decoder 407.

The auto-lock determination circuit 415 included in the address decoder 407 performs an auto-bank lock after the input of an erase enable command EE. When data is completely erased from each of the memory devices 131-1 and 133-1, the controller 110 outputs the ID of the first memory bank 130-1 to the a-bit bus 123 before outputting a status check command ST. At this time, the determination circuit 405 included in each of the memory devices 131-1 through 131-16 and 133-1 through 133-16 also compares the ID, that is ID0="0000", of the first memory bank 130-1, which is input via the input port 403, with the ID stored in the register 401.

Since only the input port 403 included in each of the memory devices 131-1 and 133-1 is enabled, the input port 403 can output the status check command ST to the status check register 413. Accordingly, the status check registers 413 included in the respective memory devices 131-1 and 133-1 can respectively output the status check signals SQ0 and SQ1 to the controller 110 via the bus 125.

Figure 8:
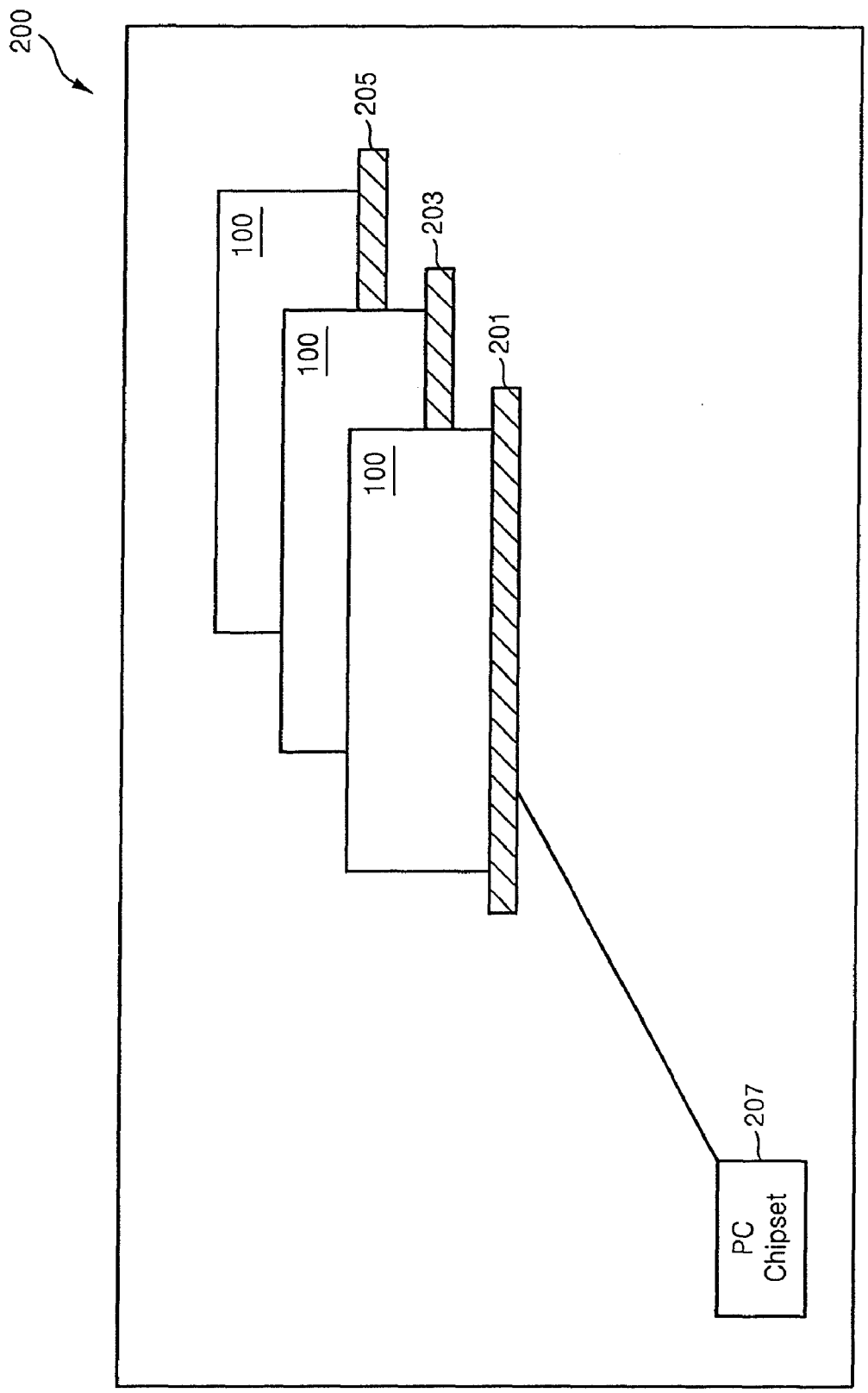
FIG. 8 is a block diagram of a main board including the memory subsystem illustrated in FIG. 2, according to an exemplary embodiment of the present invention.

FIG. 8 is a block diagram of a main board 200 including the memory subsystem 100 illustrated in FIG. 2, according to an exemplary embodiment of the present invention. The main board 200 includes a plurality of slots 201, 203, and 205 and a personal computer (PC) chipset 207.

The memory subsystem 100 according to an exemplary embodiment of the present invention may be inserted into each of the slots 201, 203, and 205. The PC chipset 207 can control the operation of a computer as a whole. The PC chipset 207 can control the operations, for example, the read operation, the write operation, the erase operation, the program operation, and the status check operation, of the memory subsystem 100 inserted into each of the slots 201, 203, and 205. The computer includes the main board 200 according to an exemplary embodiment of the present invention.

As described above, according to an exemplary embodiment of the present invention, a controller does not use bank selection signals and does not need to include separate pins for outputting the bank selection signals. Accordingly, the total number of pins in the controller can be reduced. In addition, the controller is relatively easy to design, thereby facilitating the design of a memory subsystem including the controller. As a result, the cost for design can be reduced. According to an exemplary embodiment of the present invention, the memory subsystem can easily check the operating status of each of a plurality of memory devices forming a plurality of memory banks at a desired time during an actual access.

While the present invention has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. A controller comprising:
a memory configured to store an identification (ID) of each of a plurality of memory banks; and
a control logic configured to read an ID of a memory bank to be accessed among the plurality of memory banks from the memory, then output the read ID, and then output a command,
wherein the memory bank to be accessed comprises a plurality of chips,
wherein each of the chips comprises:
an input port connected with a first bus;
a register configured to store the ID of the bank to be accessed; and
a determination circuit configured to receive and compare the ID of the memory bank to be accessed, which is input via an input port, with the ID stored in the register, and to generate a first control signal according to a result of the comparison, and
wherein the input port is enabled or disabled in response to the first control signal.

2. The controller of claim 1, wherein the command is one of a read command, a write command, an erase command, a program command, or a status check command.

3. The controller of claim 1, wherein during initialization after power-on, the control logic reads the ID stored in a register included in each of a plurality of chips forming each of the plurality of memory banks and stores the ID in the memory.

4. A memory subsystem comprising:
a plurality of memory banks;
a controller configured to control operation of each of the memory banks; and
a first bus connected between each of the memory banks and the controller,
wherein the controller outputs an identification (ID) of a memory bank to be accessed among the plurality of memory banks via the first bus before outputting a command to the memory bank to be accessed, and
wherein the memory bank to be accessed comprises a plurality of chips,
wherein each of the chips comprises:
an input port connected with the first bus;
a register configured to store the ID of the bank to be accessed; and
a determination circuit configured to receive and compare the ID of the memory bank to be accessed, which is input via the input port, with the ID stored in the register, and to generate a first control signal according to a result of the comparison, and
wherein the input port is enabled or disabled in response to the first control signal.

5. The memory subsystem of claim 4, wherein the command is one of a read command, a write command, an erase command, a program command, or a status check command.

6. The memory subsystem of claim 4, further comprising a second bus connected between each of the memory banks and the controller,
wherein the controller outputs a status check command to the memory bank to be accessed via the first bus and then receives a status check signal output from the memory bank to be accessed via the second bus so as to check a status of the memory bank to be accessed.

7. The memory subsystem of claim 4, wherein the controller comprises:
a memory configured to store an identification (ID) of each of the memory banks; and
a control logic configured to read an ID of the memory bank to be accessed from the memory, then output the ID via the first bus, and then output the command.

8. The memory subsystem of claim 7, further comprising a data bus connected between each of the memory banks and the controller,
wherein, during initialization after power-on the control logic reads via the data bus the ID stored in a register included in each of a plurality of chips forming each of the plurality of memory banks and stores the ID in the memory.

9. The memory subsystem of claim 8, wherein IDs respectively stored in registers respectively included in a plurality of chips forming one memory bank among the plurality of memory banks have the same value.

10. The memory subsystem of claim 4, wherein the memory subsystem is a memory module.

11. A method of operating a memory subsystem including a plurality of memory banks and a controller controlling an operation of each of the memory banks, the method comprising:
outputting an identification (ID) of a first memory bank from among the plurality of memory banks to the plurality of memory banks, using the controller; and
outputting a command to the plurality of memory banks after outputting the ID, using the controller,
wherein the first memory bank comprises a plurality of chips,
wherein each of the chips comprises:
an input port connected with a first bus;
a register configured to store the ID of the first memory bank; and
a determination circuit configured to receive and compare the ID of the first memory bank, which is input via an input port, with the ID stored in the register, and to generate a first control signal according to a result of the comparison, and
wherein the input port is enabled or disabled in response to the first control signal.

12. The method of claim 11, when the command is a read command, further comprising:
outputting an address, the ID of the first memory bank, and a status check command to the plurality of memory banks, using the controller;
outputting a read enable command to the first memory bank in response to a status check signal output from the first memory bank, using the controller; and receiving data that is output from the first memory bank and that corresponds to the address.

13. The method of claim 11, when the command is a write command, further comprising outputting an address, a write enable command, data to be written, the ID of the first memory bank, and a status check command to the plurality of memory banks, using the controller.

14. The method of claim 11, when the command is an erase command, further comprising outputting an address, an erase enable command, the ID of the first memory bank, and a status check command to the plurality of memory banks, using the controller.

* * * * *